United States Patent
Chiu et al.

(10) Patent No.: US 9,881,118 B2
(45) Date of Patent: Jan. 30, 2018

(54) IR-AWARE SNEAK ROUTING

(71) Applicant: SYNOPSYS TAIWAN CO., LTD., Taipei (TW)

(72) Inventors: Hsien-Shih Chiu, Taipei (TW); Kai-Shun Hu, Taipei (TW)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/576,108

(22) Filed: Dec. 18, 2014

(65) Prior Publication Data

US 2015/0278421 A1    Oct. 1, 2015

Related U.S. Application Data

(60) Provisional application No. 61/919,622, filed on Dec. 20, 2013.

(51) Int. Cl.
| | |
|---|---|
| *H01L 21/82* | (2006.01) |
| *H01L 21/44* | (2006.01) |
| *H01L 21/48* | (2006.01) |
| *H01L 21/50* | (2006.01) |
| *G06F 17/50* | (2006.01) |
| *H01L 23/498* | (2006.01) |

(52) U.S. Cl.
CPC ...... *G06F 17/5077* (2013.01); *H01L 21/4846* (2013.01); *H01L 23/49838* (2013.01); *H01L 23/49811* (2013.01); *H01L 2224/16225* (2013.01)

(58) Field of Classification Search
CPC ........................ G06F 17/5077; H01L 29/49838

USPC ................................................. 438/108, 128
See application file for complete search history.

(56) References Cited

U.S. PATENT DOCUMENTS

| | | | | |
|---|---|---|---|---|
| 2006/0294488 | A1* | 12/2006 | Waller | ............... G06F 17/5077 716/129 |
| 2009/0193382 | A1 | 7/2009 | Melzner et al. | |
| 2010/0211718 | A1* | 8/2010 | Gratz | ..................... H04L 45/00 710/317 |
| 2012/0273938 | A1* | 11/2012 | Choi | ................ H01L 23/49816 257/737 |
| 2012/0273943 | A1* | 11/2012 | Pendse | .................. H01L 21/563 257/737 |
| 2015/0178441 | A1 | 6/2015 | Chiu et al. | |

OTHER PUBLICATIONS

U.S. Appl. No. 14/576,117, Non-Final Office Action dated Jun. 23, 2016.

* cited by examiner

*Primary Examiner* — David S Blum
(74) *Attorney, Agent, or Firm* — Alston & Bird LLP

(57) ABSTRACT

A method for routing a circuit device having an array of bump pads includes identifying a routing direction associated with a bump, generating a power strap and a ground strap based on the routing direction, forming a routing channel in accordance with the routing direction, setting a start point and an endpoint in the routing channel, and connecting the start point and the endpoint using a wire within the routing channel. The method further includes placing the start point to a power or ground strap in response to a target power/ground ratio.

24 Claims, 14 Drawing Sheets

IR-AWARE SNEAK ROUTING

CROSS-REFERENCES TO RELATED APPLICATIONS

The present application claims priority to U.S. Provisional Patent Application No. 61/919,622, filed Dec. 20, 2013, entitled "IR-AWARE SNEAK ROUTING," the content of which is incorporated herein by reference in its entirety.

The present application is related to concurrently filed U.S. patent application Ser. No. 14/576,117, filed Dec. 18, 2014 now U.S. Pat. No. 9,721,056, entitled "METHOD FOR WIRE WIDENING IN CIRCUIT ROUTING SYSTEM", which is incorporated herein by reference in its entirety.

FIELD OF THE INVENTION

The present invention relates generally to semiconductor integrated circuits (ICs), and more particularly to methods and systems for routing of wires in an IC.

BACKGROUND OF THE INVENTION

Advances in IC design and manufacturing are essential to the development of electronic devices that operate at faster speed and consume less power. Adding more functionality and interfaces to an IC while reducing the size of the IC remains a challenge. The increasing number of interfaces and functionality in designs today demands ever more pads for power supply and inputs/outputs (I/Os), which undesirably result in larger die sizes (e.g., pad-limited design).

The traditional wire bond technique has its limitation because only the periphery of the die is used for external connection pads thus limiting the number of pads that may be used. Furthermore, long bond wires have resistive, inductive, and capacitive components that affect the performance of the packaged IC. Additional routing layers have to be used to bring the external signals, and power and ground terminals to the interior circuitry of the IC. Such problems have been partly addressed by flip chip techniques. In a flip chip, the pads (interchangeably referred to as bumps or bump pads) are disposed over the surface of the chip instead of along its periphery. The number of pads is increased and the routing to the internal logic of the chip is shorter comparing with wire-bond techniques. Flip chip technology thus has high electrical performance due to the relatively low resistive, inductive and capacitive parasitics with a higher number of pads in a relatively small-sized package.

A Flip-chip package uses solder bumps deposited on the chip pads to establish connections to external circuits. The solder bumps are disposed on the top layer of the chip. The chip is mounted upside down with its top layer facing down so that the bump pads are aligned with the solder pads of an external circuit. FIG. 1 is a cross-sectional view of a flip-chip mounted with its top layer facing down to a package carrier. As shown, a flip-chip 100 includes multiple bump pads 102 on a redistribution layer 104 and multiple solder bumps 106 associated with the bump pads. Redistribution layer 104 may include multiple I/O drivers 110 and is disposed on a top metal layer 108. Flip-chip 100 may also include a semiconductor layer 116 disposed on a substrate 118. Flip-chip 100 may further include multiple metal layers including a first metal layer 114 disposed on semiconductor layer 116 and multiple dielectric layers (not shown) interposed between the metal layers. Semiconductor layer 116 includes electronic devices such as transistors, resistors, capacitors, inductors, memory elements that may be connected to each other and to the bump pads through the multiple metal layers. Flip-chip 100 is mounted upside down with solder bumps 106 connected to a package carrier 120.

FIG. 2 is a top view of an exemplary bump pad layout 210 and nets/wires 212 of a flip-chip 200. As shown, bump pad layout 210 includes multiple bump pads 220 (shown as octagon), multiple I/O drivers 230 (shown as the two internal rings), and multiple power/ground rings 240. Bump pads 220 may include core bump pads and I/O bump pads that are connected to other regions of flip-chip 200 using nets/wires 212 on a redistribution layer 206. Bump layout 210 may have core bump pads disposed at the central region and I/O bump pads at the peripheral region. Redistribution layer 206 may include one or more nets/wires 212 connected to I/O drivers 230 through I/O pads 232 and one or more nets 212 connected to power/ground rings 240 through power/ground pads 242. As a result of placing the core bump pads in the interior of the flip-chip and the I/O bump pads near the periphery, connections between the core bump pads and the I/O drivers and the power/ground rings can become challenging.

FIG. 3 is a straight-line routing of a portion 300 of a flip-chip, as known in the prior art. Portion 300 of a redistribution layer includes three rows of bump pads having a similar size. The bump pads are represented by octagons. As shown, spaces 303, 305 between bump pads in two adjacent rows 311, 313 are used for traces 321, 323, i.e., there is no space available for power routing from the core bump pads in the core region to the peripheral region. The problem is further exacerbated as the wire for power routing must have a large width to reduce the resistive, inductive and capacitive parasitics due to the long connection wiring from the core region to the peripheral region.

BRIEF SUMMARY OF THE INVENTION

Embodiments of the present invention relate to the routing of power, ground, and signal nets in an integrated circuit, and more particularly to methods for routing an integrated circuit having an array of bumps. An embodiment of the present invention provides a method for routing an integrated circuit having an array of bumps (e.g., a flip chip). The method includes: identifying a routing direction associated with a bump, forming a routing channel in response to the routing direction, setting a start point and an endpoint in the routing channel, and connecting the start point and the endpoint using a wire within the routing channel. In an embodiment, identifying the routing direction is based on one or more pre-routed nets associated with the bump. In an embodiment, forming the routing channel includes setting a boundary around the center of the bump, extending the boundary lengthwise in the routing direction, and determining whether the boundary is extendable in the routing direction. In the case that the boundary is determined to be extendable in the routing direction, the method includes extending the boundary until it contacts a power/ground (P/G) bump, a P/G strap, or a barrier. In the case that the boundary is determined to be not extendable in the routing direction, the method includes terminating the boundary extension. In an embodiment, the method further includes extending the boundary widthwise in a direction orthogonal to the routing direction until the boundary reaches the center of adjacent bumps arranged lengthwise in the routing direction. The boundary straddles two adjacent power/ground straps.

In an embodiment, the method also includes calculating a routing area within the boundary. The routing area has a first edge associated with the start point and a second edge associated with the endpoint that is located farthest from the start point in the routing direction.

In an embodiment, the endpoint is located at the center of the second edge, and the wire interconnecting the start point and the endpoint comprises a plurality of partially overlapped segments, each of the overlapped segments has a regularly polygonal shape. The polygonal shape may be a rectangle or an octagon.

An embodiment of the present invention provides a non-transitory computer-readable medium comprising instructions which when executed by a computer cause the computer to identify a routing direction associated with a bump pad, form a routing channel in accordance with the routing direction, set a start point and an endpoint in the routing channel, and connect the start point and the endpoint using a wire within the routing channel.

An embodiment of the present invention includes a system for routing a circuit device having an array of bumps. The system includes a memory configured to store a layout of the circuit device having core power and ground (P/G) bump pads and I/O bump pads, and a computer configured to: identify a routing direction associated with a bump, form a routing channel in accordance with the routing direction, set a start point and an endpoint in the routing channel, and connect the start point and the endpoint using a wire within the routing channel.

An embodiment of the present invention includes a device. The device includes a core region and a peripheral region, a redistribution layer comprising a plurality of bump pads disposed in the core region and in the peripheral region, a plurality of straps associated with bump pads in the core regions, a plurality of nets disposed on the redistribution layer and snaking around one or more bump pads along a first direction, a power or ground net connected to one of the straps and sneaking between a portion of two adjacent columns or a portion of two adjacent rows of bump pads, the power or ground net having a plurality of segments having a same width or different widths.

The following description, together with the accompanying drawings, will provide a better understanding of the nature and advantages of the claimed invention.

DETAILED DESCRIPTION OF THE INVENTION

The following terms are defined in the present application:

RDL is an abbreviation of Redistribution layer and refers to the top most layer that connects the bumps in a flip-chip design. A redistribution layer is a metal layer on a chip that allows the I/O pads of an IC available in other locations.

Bumps refer to cells used at the top-layer of a flip-chip design representing access points to provide connections between exterior and internal circuitry of the chip. Bumps are solder spheres attached to the bump pads. A RDL may be used to reroute the chip pads to the bump pads. In this application, the bumps may be used interchangeably as bump cells, bump pads or flip-chip bumps and may denote core bumps or I/O (Inputs/Outputs) bumps.

Core bumps refer to power (e.g., VDD) and ground (e.g., VSS) bumps which are generally concentrated in the central portion of the chip. A core bump may be used interchangeably as a power bump or a ground bump.

I/O bumps refer to bumps that connect either signals, power (e.g. VDDIO) or ground (e.g. VSSIO) that is located above the I/O region of the chip, around the chip boundary associated with the I/O pads.

Flip Chip Drivers refer to the I/O pad cells or the IP functional blocks at the boundary of the chip that connect to the I/O bumps at the top-most layer to the internal circuit of the chip in the lower layers. I/O pads are referred to as flip chip drivers or drivers.

Snake Routing refers to routing the RDL nets in a zigzag snake-like fashion as opposed to a straight-line routing.

Sneaking refers to routing the power/ground nets from core bumps (central portion of the chip) and "sneaking" them over the I/O region. Sneaking is used to improve the voltage (IR) drop near the chip boundary.

Strap is an elongate conductive wire connecting to a power or ground bump.

Bump Pitch refers to the bump-to-bump distance between two adjacent bumps disposed in the same row or in the same column.

Embodiments of the present invention provide routing methods and devices for a flip-chip package. According to an embodiment, an IC design specification is prepared, a functional description corresponding to the IC specification is generated, a gate-level circuit description is synthesized from the functional description, a simulation is performed to verify the gate-level circuit against the functional description, and a layout is performed based on a database of the flip-chip package.

Figure 1:
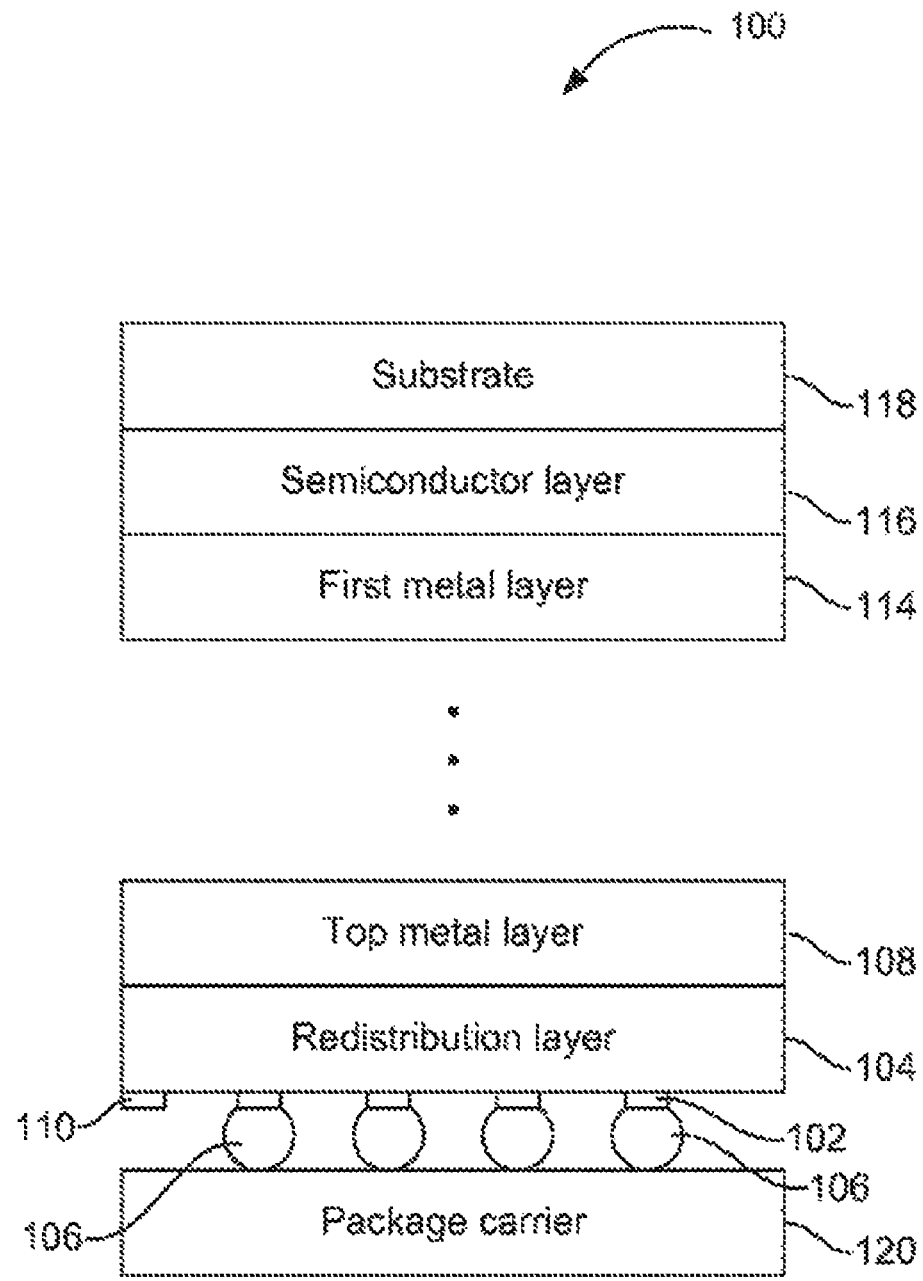
FIG. 1 is a cross-sectional view of a flip-chip integrated circuit, as known in the prior art.
Figure 2:
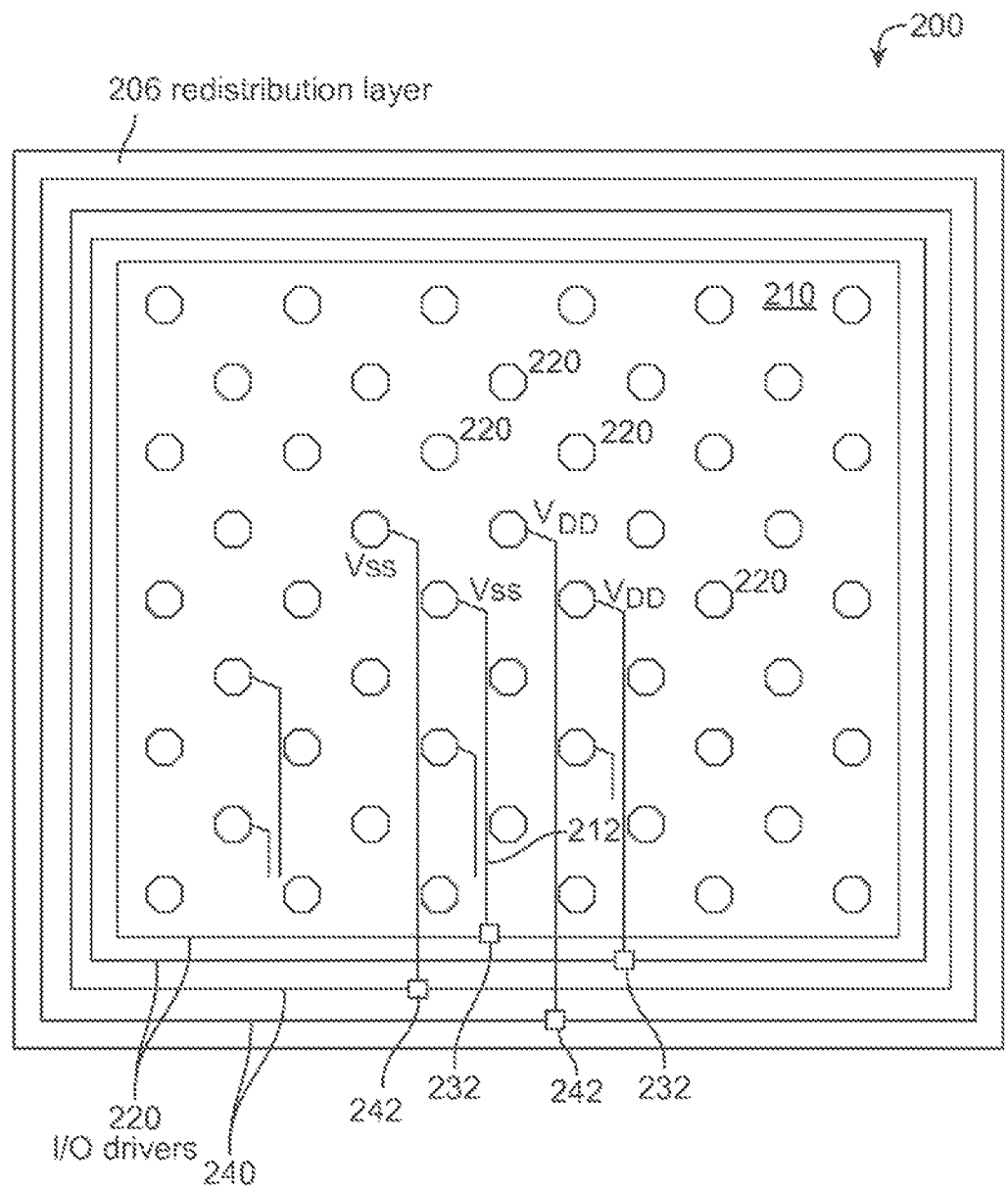
FIG. 2 is a top view of a redistribution layer of a flip-chip, as known in the prior art.
Figure 3:
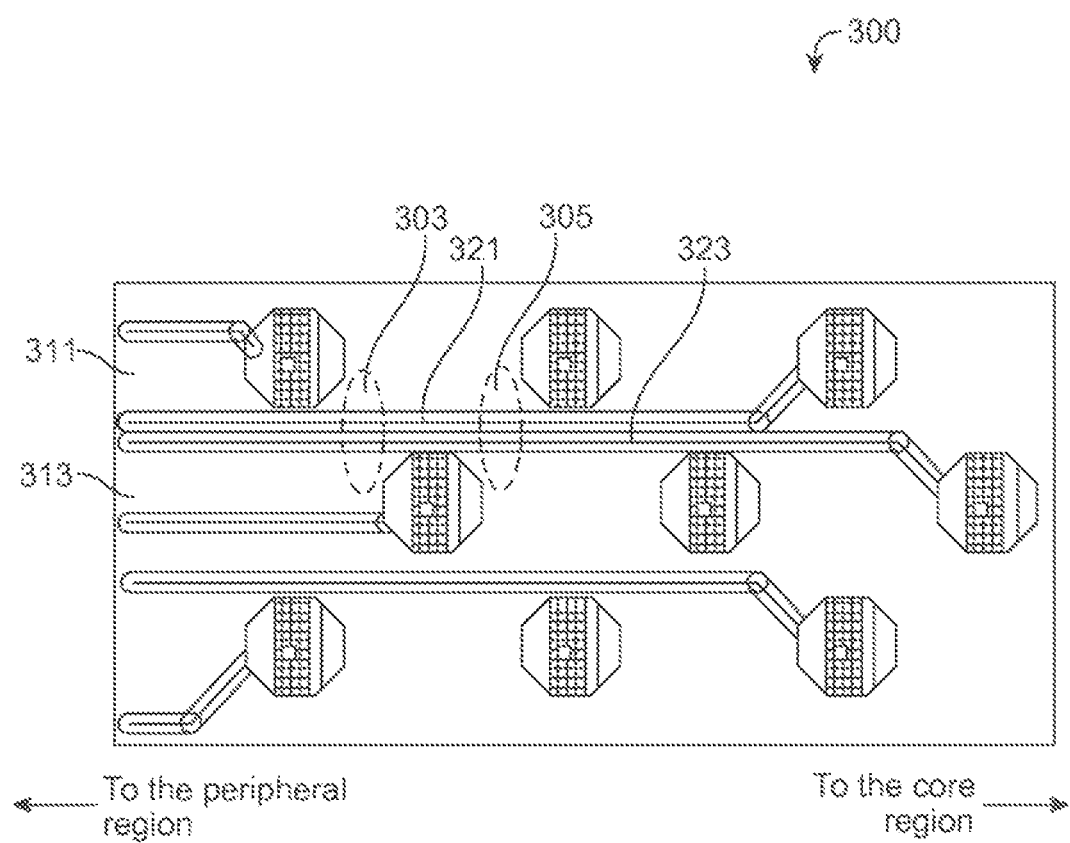
FIG. 3 is a straight-line routing example, as known in the prior art.
Figure 4:
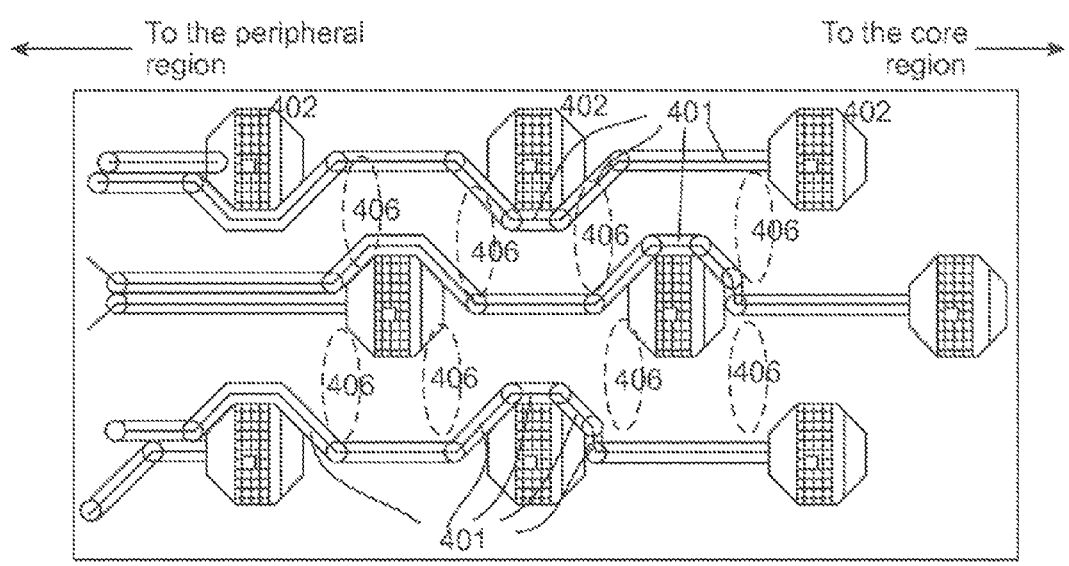
FIG. 4 is an example snake routing for reserving routing resources according to an embodiment of the present invention.

In accordance with the present invention, the EDA tool routes the nets around the periphery of bump pads (alternatively referred to as bumps) using a snake routing technique. In snake routing, the nets are contouring around the bumps to creates a snake like zigzag routing pattern. FIG. 4 is an example snake routing according to an embodiment of the present invention. As shown, snaking routing provides additional routing resources for power and ground sneak routing. By routing around bumps, the EDA tool automatically increases wire clearance (open space) by pushing the interconnect wires 401 closest to the contour (periphery) of the I/O bumps 402 using a snake-like routing pattern. As shown in FIG. 4, snaking routing creates open spaces 406 between bump pads in adjacent rows.

In an exemplary embodiment, an integrated circuit flip-chip includes I/O (Input/Output) pads, bumps, and RDL (Redistribution Layer) metal layer. The RDL layer includes nets (interconnect wires) that connects the pads and the bumps. The bumps may include core power and ground bumps and I/O bumps. The core power and ground bumps may be located in the center of the chip and the I/O bumps may be located around the periphery of the chip. The circuitry located below the bumps may receive less power due to an IR voltage drop. To reduce the IR voltage drop and to effectively utilize the RDL layer, sneaking from the nearest power and ground bumps into the I/O bumps will be performed.

Figure 5:
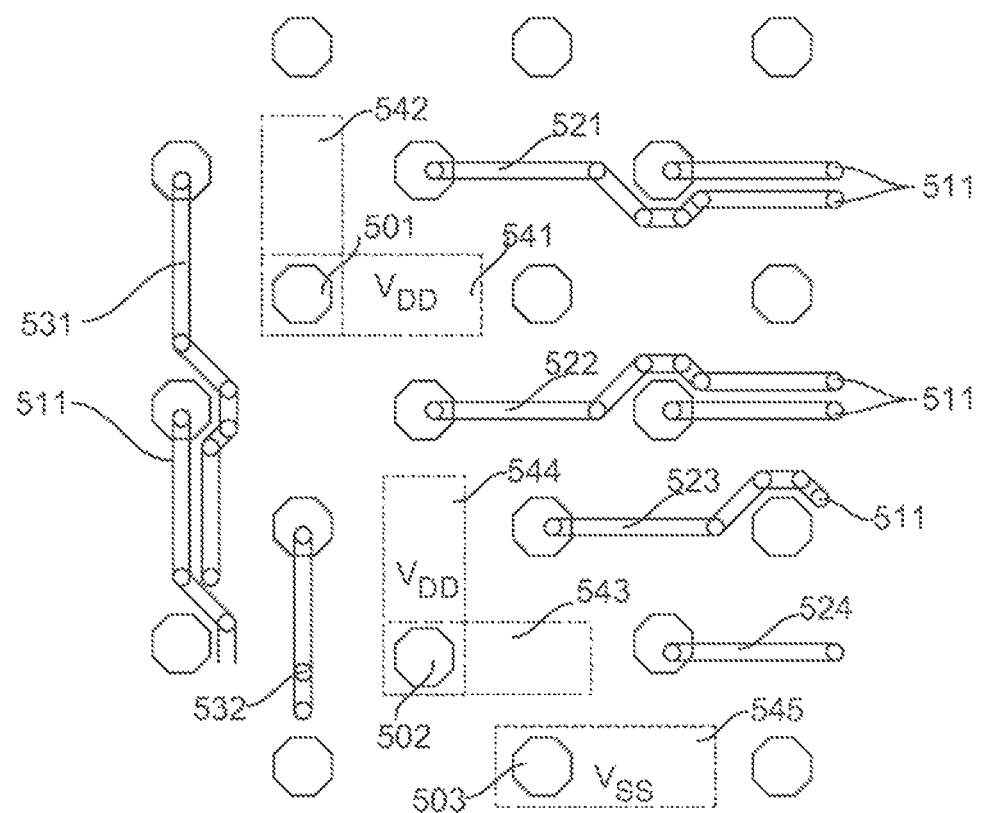
FIG. 5 is an example of generating power/ground straps in response to the routing directions according to an embodiment of the present invention.

FIG. 5 is an example of creating straps to power (VDD) or ground (VSS) bump pads according to an embodiment of the present invention. As shown, the straps can be rectangular shaped and connected to power and/or ground bump pads in a horizontal or a vertical direction. The direction of the straps may be determined by the direction of neighboring wires. Referring to FIG. 5, seven rows of bump pads each having three pads are shown. In this example, bump pads 501, 502, 503 are power/ground (VDD/VSS) pads, the other pads are I/O pads. Bump pads are shown as octagons and straps are shown as rectangles. Bump pad 501 is located in the vicinity of horizontal nets 521, 522 and a vertical net 531, so that the EDA tool creates a strap 541 based on horizontal nets 521, 522 or a strap 542 based on vertical net 531. Similarly, bump pad 502 is located in the vicinity of horizontal nets 523, 524 and a vertical net 532, so that the EDA tool creates a strap 543 based on horizontal nets 523, 524, or a strap 544 based on vertical net 532. Bump pad 503 is located in the vicinity of horizontal net 524, so that the EDA tool creates a strap 545 based on horizontal net 524.

Figure 6:
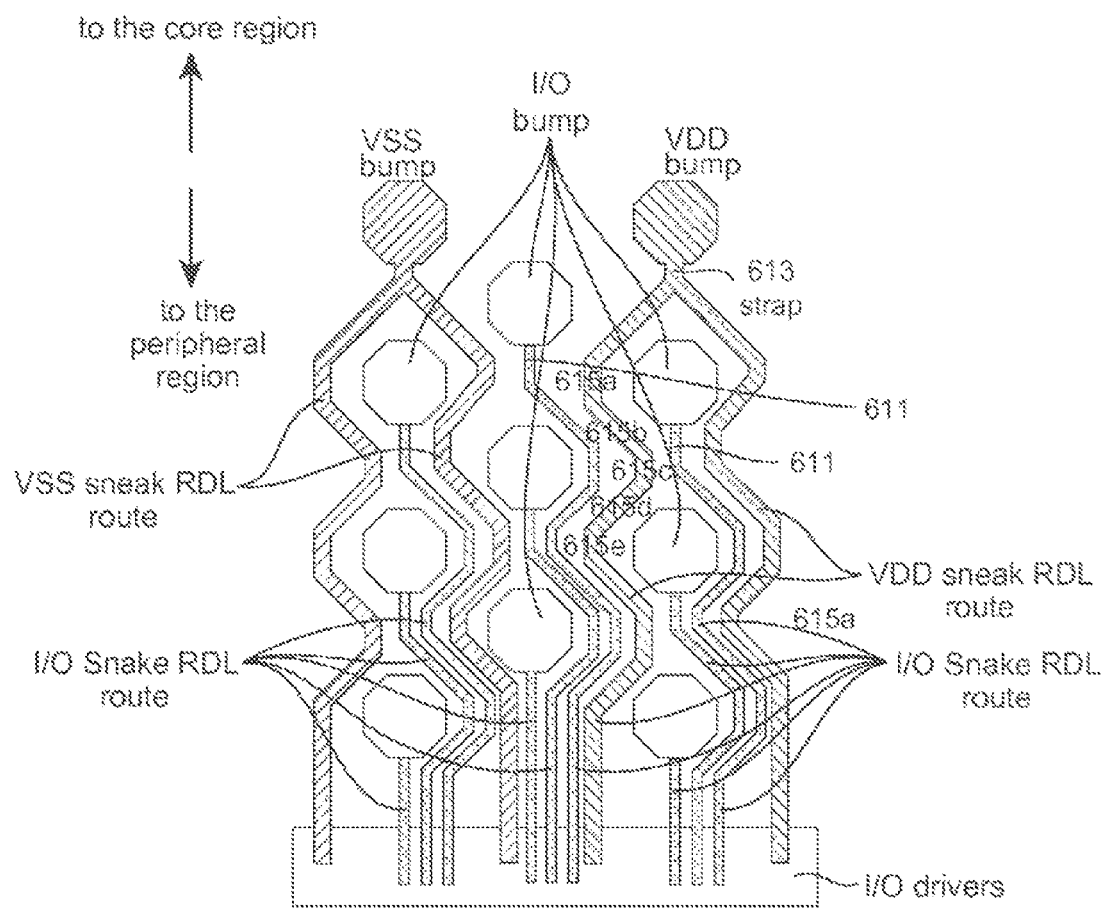
FIG. 6 is an example of I/O snake routing and sneaking of power/ground nets into a portion of the I/O region according to an embodiment of the present invention.

FIG. 6 is an exemplary sneak routing of power/ground nets into the I/O drivers region according to an embodiment of the present invention. In the example shown, the electronic design automation tool routes I/O nets of the chip to their respective I/O drivers in a snake-like fashion to reserve resources. The design automation tool then creates straps for the power and ground bumps. Thereafter, the design automation tool routes the power and ground nets from the core region into the peripheral region to supply power to the I/O drivers using the reserved resources. In an embodiment, I/O nets may have a width that is different from the width of the power or ground nets.

As shown in FIG. 6, VDD/VSS (i.e., power/ground) nets are routed from the core region into the I/O region. In an embodiment, power/ground nets are "sneaked" into the I/O region as far as possible after the I/O nets 611 are routed. Straps 613 are created in the direction along the I/O nets. The sneaking (routing) of the power/ground nets in the I/O region is to decrease IR voltage drop near the IO region. It is noted that although FIG. 6 shows that power and ground nets appear to be symmetrical, there is no requirement to be so. In an embodiment, the power/ground nets include multiple wire segments (615a, 615b, 615c, 615d, 615e, etc) sneaking through the reserved resources. Each of the segments may have the same or different width. Segments may have a larger width where more resources are available to reduce the resistance of the power/ground nets. In another embodiment, the number of power nets may or may not be the same as the number of ground nets. For example, an IP block in the flip-chip device may have an I/O bus having multiple signal outputs (e.g., data, address bus). The I/O bus may have different power requirements for driving an electrical "1" vs. driving an electrical "0". For example, the I/O bus of the IP block may require a power net for every three outputs but a ground net for every two outputs. For example, in some double data rate (DDR) synchronous dynamic random access memory (SDRAM), more power is consumed driving a "0" than a "1" so that the number of ground nets for the outputs of the IP block is greater than the number of power nets. In another case, the requirement of power and ground nets may reverse. Embodiments of the present invention provide options to select the ratio between the power and ground nets. The ratio of two integer numbers can be an integer or a rational number in an embodiment.

Figure 7:
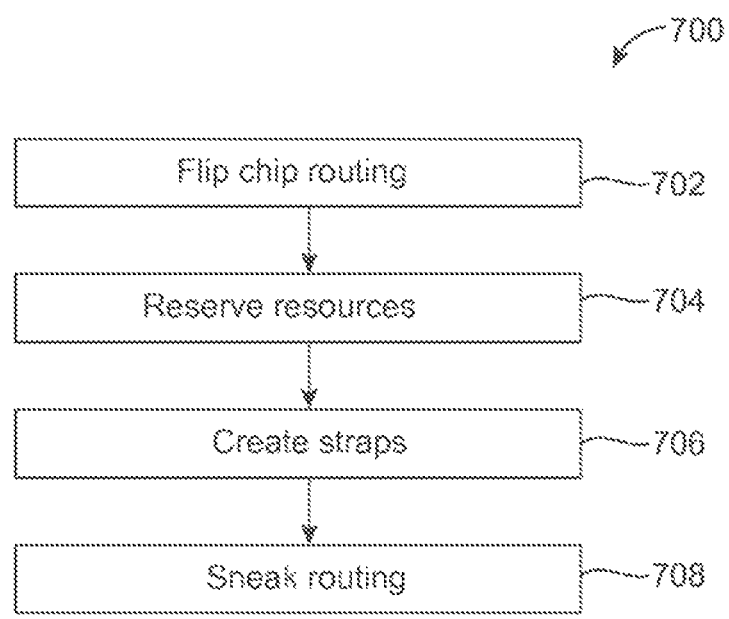
FIG. 7 is a simplified flow chart of a method of sneak routing for an integrated circuit according to an embodiment of the present invention.

FIG. 7 is a simplified flow chart of a method 700 according to an embodiment of the present invention. Method 700 comprises a step 702 that may contain a library preparation, a pad-ring creation, bump creation, bump assessment and assignment, and automatic bump net routing. Method 700 also includes a step 704 that reserves routing resources, a step 706 for creating straps for power and ground bumps, and a step 708 for sneak routing. The pad-ring creation may be an iterative process, which involves assessing the number of available I/O bumps based on the depth allowed by a package designer or system designer. The depth of the bumps can be changed by the package designer, if the number of I/O flip-chip drivers are more than the available 10 bumps. The flip-chip routing may include performing flip-chip redistribution layer routing on the flip chip nets. The redistribution layer routing may include 90 degree routing or 45 degree routing.

In an embodiment, the pad-ring may include a HDL netlist such as a Verilog netlist, I/O pads constraints (location and order), pitch and depth of the I/O pads. The netlist may include top level I/O signals. The user specifies the locations for the I/O pads corresponding to those top level I/O signals and specifies the order in which those I/O pads are to be placed around the periphery of the flip-chip die. The user also specifies power/ground bump pads. In a preferred embodiment, the power/ground pads are placed at the interior of the die (core area) and the I/O pads at the periphery of the die. The bumps may be created based on a database of a known package substrate or they may be created based on requirements of a user defined system. The design tool may automatically assess and assign power/ground and I/O drivers based on information obtained from the library and the created pad-ring. In an embodiment, a bump that is located closest to a driver is assigned to that driver to obtain the shortest net. All drivers are assigned to their respective bumps that are located at the shortest distance from them.

Upon completion of flip-chip routing, method 700 performs step 704 that includes reserving routing resources. Reserving routing resources comprises pushing nets away to create more routing resources. In an embodiment, reserving resources may include snake routing (FIG. 4). Snake routing refers to routing a net on the RDL around the bumps in a zigzag pattern taking the shape of the bumps rather than in a straight path to enable late sneaking routing of core power and grounds. Step 706 may include creating straps for power and ground bumps. The straps are elongate conductive wires or nets that connect horizontally or vertically to power or ground bumps (FIG. 5). Step 708 includes sneak routing that performs routing of the core power and ground nets on the redistribution layer from the core region into the I/O pad region (FIG. 6) using the reserved routing resources obtained in step 104. The routing of the core power and ground nets into the I/O pad area will be performed last and will be sneaked as deep as possible into the I/O pad area. The sneaking of the core power/ground nets into the I/O pad area will reduce the IR (voltage) drop near the I/O area. The IR drop will be further reduced by automatically widening the width of the sneaked power/ground nets as much as possible according to embodiments of the present invention.

The flip chip routing may include connecting I/O bumps to their corresponding drivers and the I/O power and ground (VDD/VSS) nets to the I/O core power and ground pads (power/ground bumps).

After the generation of the power/ground straps, method 700 continues to step 708, which performs sneaking of core power/ground nets (connected to core power and ground bumps via the straps) from the core area to the IO area. This sneaking is useful to supply power to the IO region. FIG. 6 is an exemplary sneak routing of power/ground nets according to an embodiment of the present invention. In the example shown, the design automation tool routes I/O nets of the chip to their respective I/O bump pads in a snake-like fashion to reserve routing resources, i.e., creating open spaces between adjacent bump pads in adjacent columns or rows of bump pads. The design automation tool then creates straps for the power and ground bumps. Thereafter, the design automation tool routes the power and ground nets from the core area into the I/O area to supply power to the I/O drivers using the reserved resources.

The design tool of the present invention provides utility for sneaking the core power and ground nets to the I/O region using the reserved routing resources. A representative flow for sneaking power/ground nets is outlined in steps 1 to 9 below.

1. Search a bump of the flip chip (801, FIG. 8A);
2. Identify the access direction of the nets that are connected to corresponding bumps;
3. Extend a virtual box (block, boundary) that is initially located around the center of the bump (802, FIG. 8A);
4. Extend the box in a first access direction along a first routing direction (803, FIG. 8B, 804, FIG. 8C);
5. Extend the box in a second access direction that is opposite to the first access direction (805, FIG. 8D);
6. Extend the box in a third access direction that is orthogonal to the first routing direction (806, FIG. 8E; 807, FIG. 8F);
7. Obtain a channel that may be the smallest possible rectangle that straddle at least a power and ground strap (809, FIG. 8G);
8. Obtain another channel by extending the box in a fourth access direction that is opposite to the third access direction (810, FIG. 8H); and
9. Repeat steps 1 through 6 for every bump.

Figure 8A:
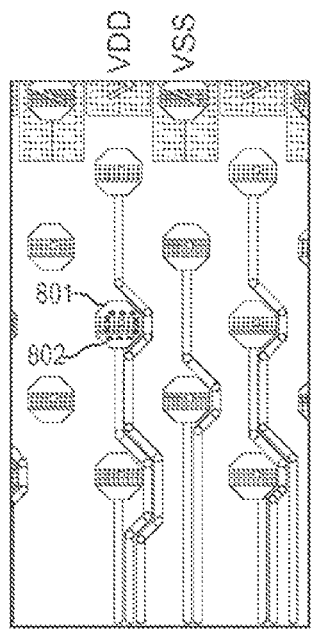
FIG. 8A is an example of placing a virtual box (block) around the center of a bump according to an embodiment of the present invention.

In step 1 of the flow, the electronic design automation (EDA) tool according to embodiments of the present invention identifies a bump of the flip chip. The bump may be connected to a pre-routed net having a predetermined width. In step 2, the EDA tool determines the access direction of the pre-routed net. In step 3, the EDA tool places a virtual box around the center of the bump. The box may be a rectangular block having initial dimensions of the net width. FIG. 8A is an example of a virtual box 802 placed around the center of a bump 801 according to an embodiment of the present invention.

Figure 8B:
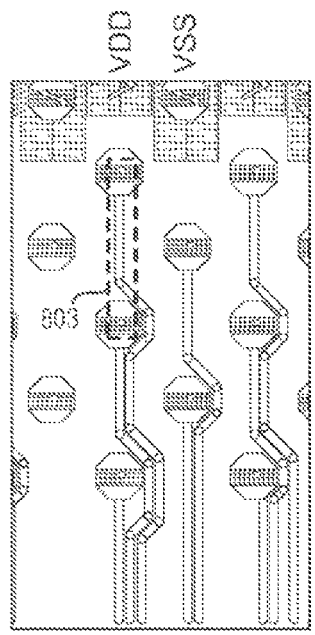
FIG. 8B is an example of extending the box lengthwise in an access direction according to an embodiment of the present invention.
Figure 8C:
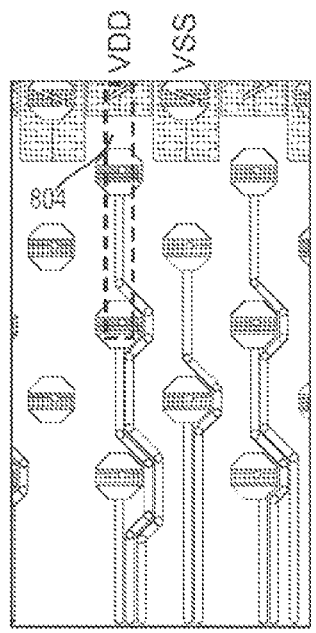
FIG. 8C is an example of further extending the box lengthwise in the access direction according to an embodiment of the present invention.
Figure 8D:
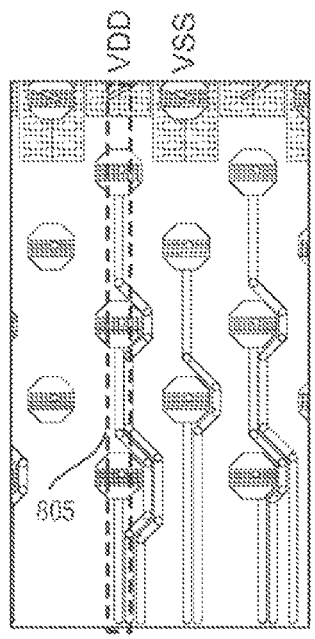
FIG. 8D is an example of further extending the box lengthwise in the access direction according to an embodiment of the present invention.

In step 4, the EDA tool extends the rectangular block lengthwise to a distance along the access direction determined by the pre-routed net. In an embodiment, the distance may be the bump-to-bump pitch along the access direction. FIG. 8B is an example showing that a box 803 is extended to the next bump in a first direction (e.g., north) along the access direction. When the extended rectangle is in contact with the next bump, the EDA tool will check whether box 803 can be further extended in the same direction. In the event that box 803 can be further extended in the same direction, then the EDA tool will extend box 803 until it is in contact with a power or ground bump or strap or it is blocked by a pre-routed wire, as shown in FIG. 8C. In step 5, the EDA tool will stop the box extension in the first access direction and extends the box in the reversed access direction until it is blocked again, as shown in FIG. 8D. Note that, in accordance with the present invention, there are four routing direction: horizontal (0 degree), vertical (90 degree), and diagonal (±45 degree), and eight access directions. For example, the access direction "south" and access direction "south-east" may be the same routing direction according to embodiments of the present invention.

Figure 8E:
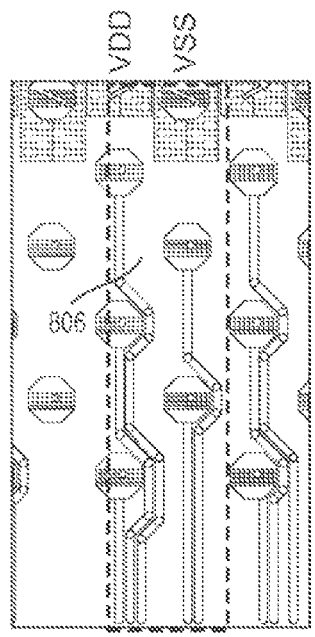
FIG. 8E is an example of extending the box widthwise in a direction orthogonal to the access direction according to an embodiment of the present invention.
Figure 8F:
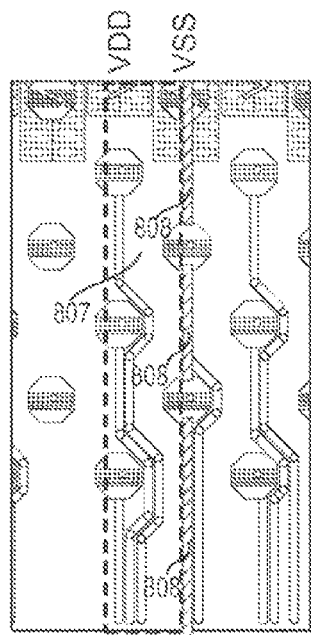
FIG. 8F is an example of generating a blockage within the box to define the box boundary according to an embodiment of the present invention.
Figure 8G:
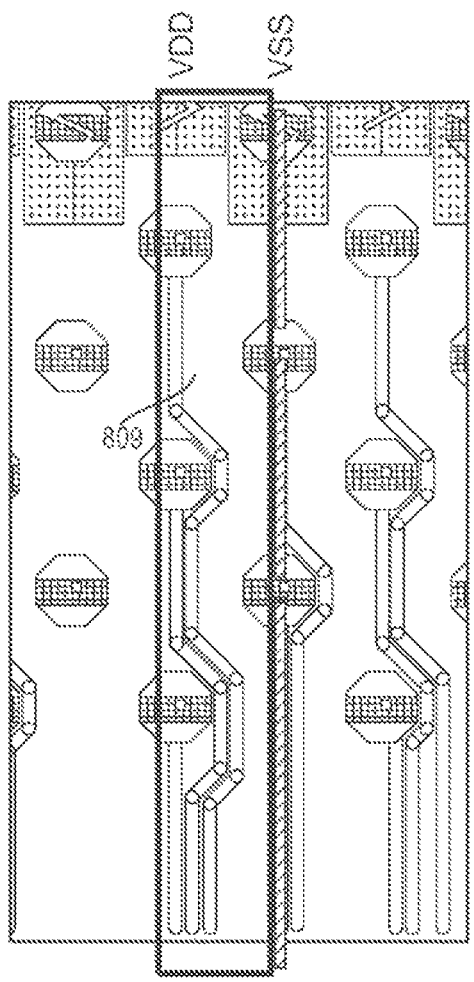
FIG. 8G is an example of generating a routing channel according to an embodiment of the present invention

In step 6, after the virtual box is blocked in both directions, the EDA tool extends the width of the lengthwise extended box. In other words, the box is now extended in a direction orthogonal to the access direction for a distance, i.e., if the access direction is vertical, then the direction orthogonal to the access direction is horizontal. Conversely, if the access direction is horizontal, then the direction orthogonal to the access direction is vertical. In an embodiment, the width of the box is equal to the bump-to-bump pitch in the horizontal direction. In another embodiment, the width of the box is extended beyond the horizontal (vertical) bump-to-bump pitch, as shown in FIG. 8E. In the case where the box is extended beyond the bump pitch, the EDA tool may add blockages 808 (step 7), which may be straight lines connecting the bumps along the access direction to limit the width of box 807, as shown in FIG. 8F. FIG. 8G is an example of a box 809 that is generated using the steps 1 to 7 described above.

Figure 8H:
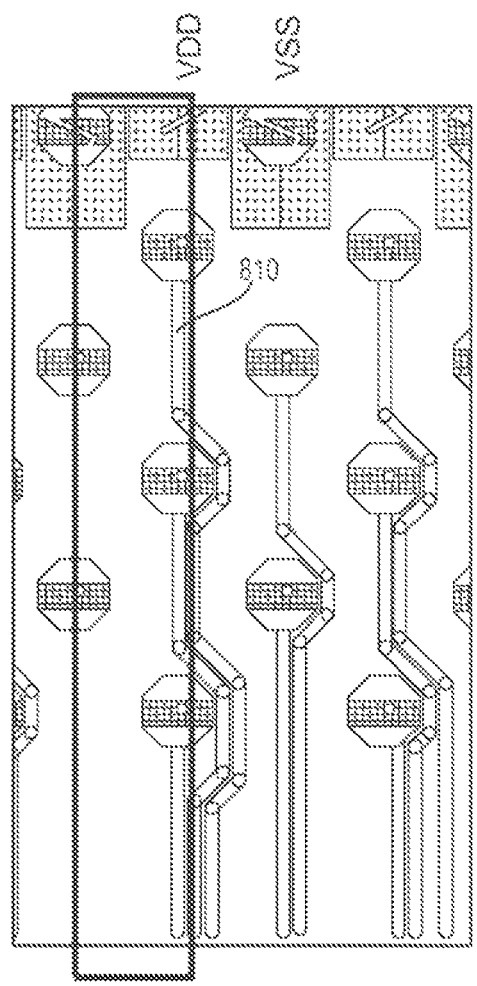
FIG. 8H is an example of generating another routing channel according to an embodiment of the present invention

In step 8, embodiments of the present invention may extend the width of the box in an opposite direction to generate a new box 810, as shown in FIG. 8H. In an embodiment, the EDA tool may repeat the steps described above to generate boxes this way to partition the chip into a multitude of continuous non-overlapping boxes that are referred to as routing channels for routing power/ground nets in the I/O region. In some embodiments, the continuous non-overlapping boxes may have the same size (dimension). In other embodiments, the continuous non-overlapping boxes may have different sizes.

Figure 9:
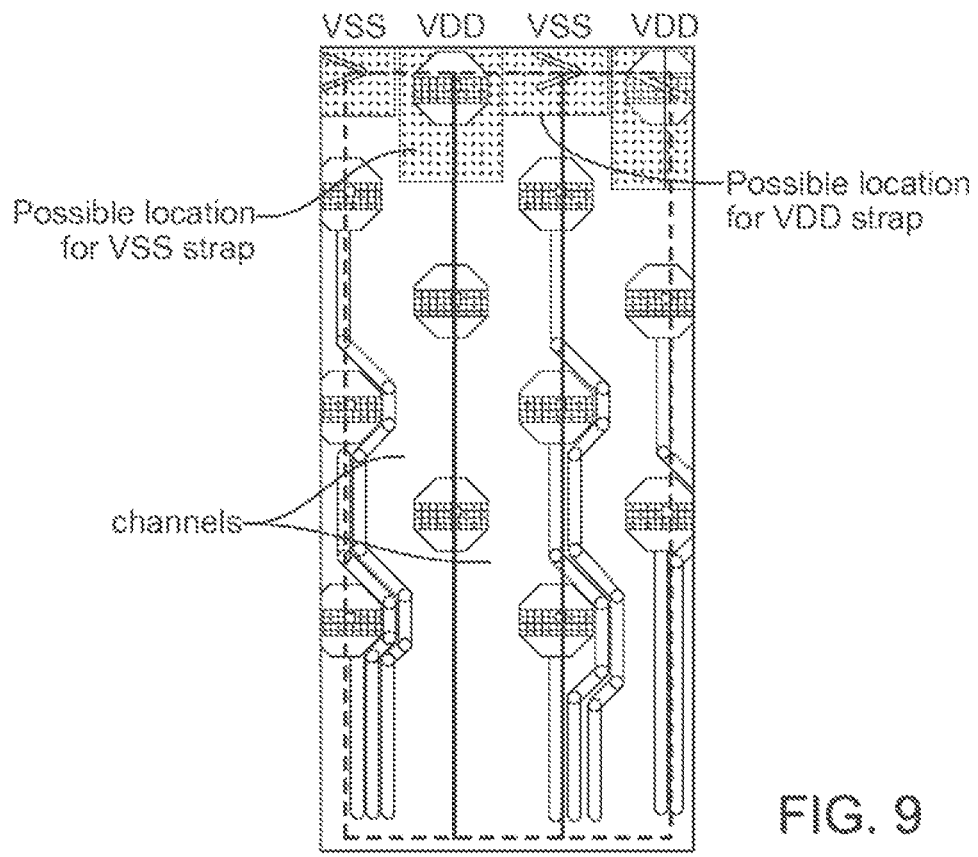
FIG. 9 is an exemplary channel partitioning and straps generation for power and ground pads according to an embodiment of the present invention.

FIG. 9 is an example of a portion of a chip that is partitioned into three channels 901, 902, 903 according to an embodiment of the present invention. As shown, the channels are rectangular-shaped and arranged lengthwise adjacent to each other. The two lengthwise sides of each channel run across two adjacent columns (or rows) of the bumps, and one widthwise side of the channel straddles two adjacent power/ground straps.

In an embodiment, the possible location of power/ground straps can be determined based on the access direction of the channel. For example, if the multitude of channels is formed along the vertical direction of the die (redistribution layer), then the possible location of a strap is searched in the same direction, i.e., in the vertical direction. Conversely, if the channels are formed in the horizontal direction, then the possible location of a strap is searched in the horizontal direction as that of the channels. The searching range of the strap is based on the bump-to-bump distance, i.e., the bump pitch in the lengthwise direction of the channel. The power and ground strap location within a channel allows the design tool to select either a VDD or a VSS net that need to be sneaked within the channel. The channel thus forms a virtual boundary that constraints the power or ground wire to sneak within the channel. It is understood that, although FIG. 9 shows the channels in the vertical direction, the EDA tool of the present invention also works for channels partitioned in the horizontal direction.

Figure 10:
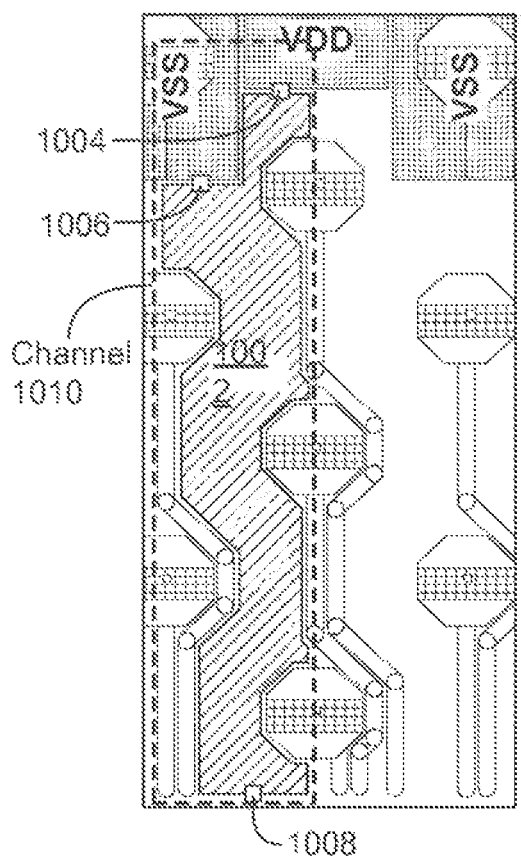
FIG. 10 is an exemplary setting of a start point and an endpoint in a channel according to an embodiment of the present invention.

After determining locations of straps in a channel, the EDA tool calculates the routing area associated with that channel. FIG. 10 shows an example area 1002 available for routing a power or ground net within a channel 1010. The EDA tool determines a start point and an end point within the routing area. In an embodiment, the start point is set on the power/ground strap. As shown, there are two start points 1004, 1006 for the respective power and ground straps. In an embodiment, the endpoint 1008 is the farthest routable point in the channel and can be located at the center of the opposite edge of the routable area. Thereafter, if a VDD net is required in this channel, then the EDA tool connects start point 1004 with endpoint 1008. Conversely, if a VSS net is required for this channel, then the EDA tool connects start point 1006 with endpoint 1008.

Figure 11C:
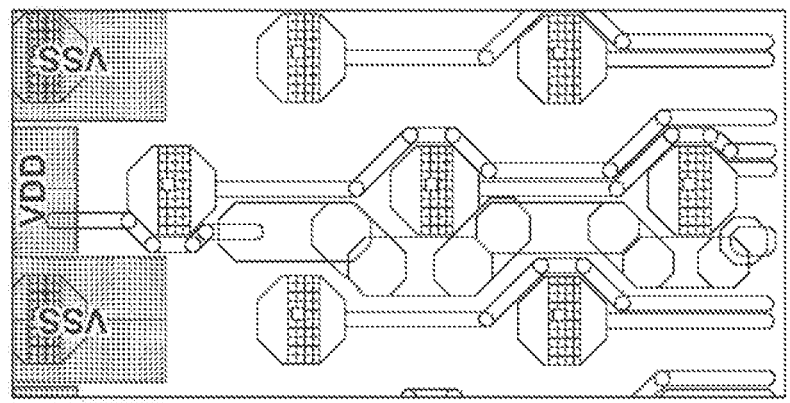
FIG. 11C shows an example of widening a power net according to an embodiment of the present invention.
Figure 11B:
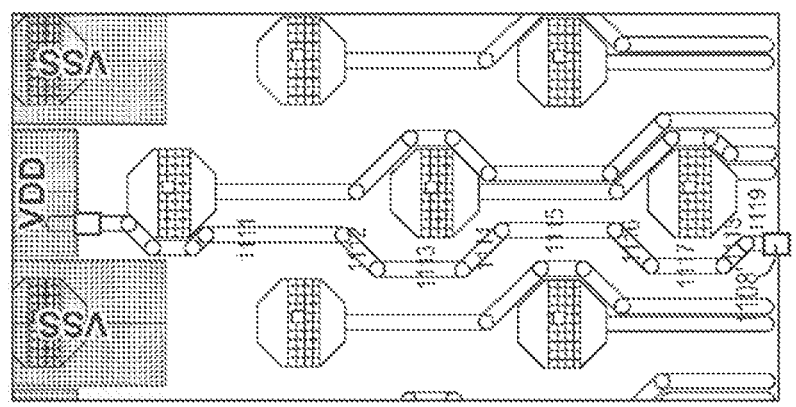
FIG. 11B shows an example of spreading a power net according to an embodiment of the present invention.
Figure 11A:
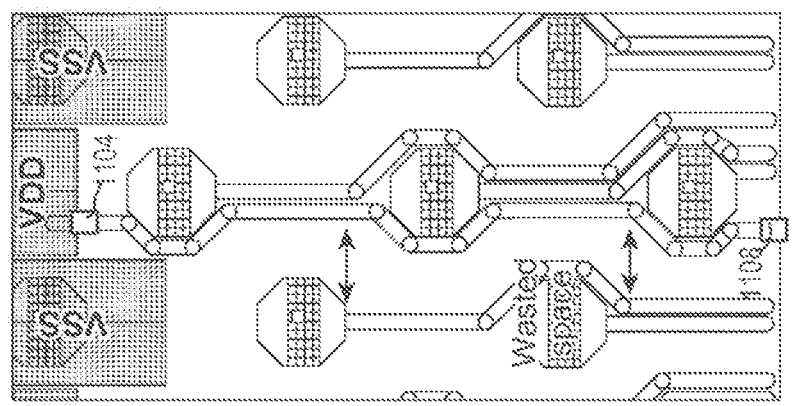
FIG. 11A shows an example of sneaking a power net according to an embodiment of the present invention.

FIG. 11A shows that the interconnect wire connects the start point 1104 with the endpoint 1108 by contouring along the intermediate I/O bumps according to an embodiment of the present invention. As shown, there is a considerable space waste in the routable area for the VDD wire. Embodiments of the present invention allow automatically spreading the power/ground interconnect wire in the routable area by moving the interconnect wire approximately to the center of the routable area, as shown in FIG. 11B. In an embodiment, the EDA toll moves the endpoint 1108' to the center of the routable area and routes the VDD wire in the middle of the available routing area. It is noted that the interconnect wire comprises a plurality of partially overlapped segments (e.g., segments 1111 through 1119). The segments may have a regularly polygonal shape such as a rectangle or an octagon. Embodiments of the present invention further allow the widening of the segments by observing the design rule checking (DRC), as shown in FIG. 11C.

Figure 11D:
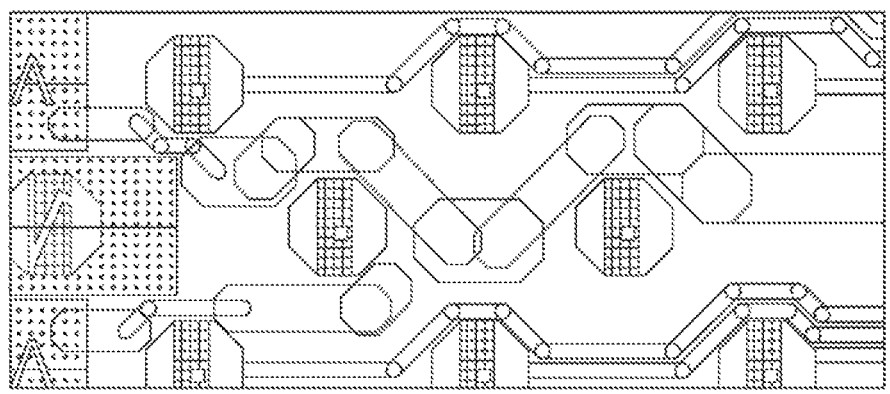
FIG. 11D shows an example of the ordering problem in the conventional art.

Embodiments of the present invention also provide solutions for the ordering problem that occurs frequently in routing. FIG. 11D shows an example of the ordering problem. In the example shown, if the wire on the right-hand side is routed and widened first, it may block the routing resources for the left-hand side. To prevent the blockage, the present invention can route and widen both sides by separating channels. In other words, by partitioning the chip (redistribution layer) into multiple non-overlapping routing channels (virtual boxes), the blockage of routing resources on adjacent channels can be avoided. Thus, embodiments of the present invention can adequately use free routing resources.

Figure 12:
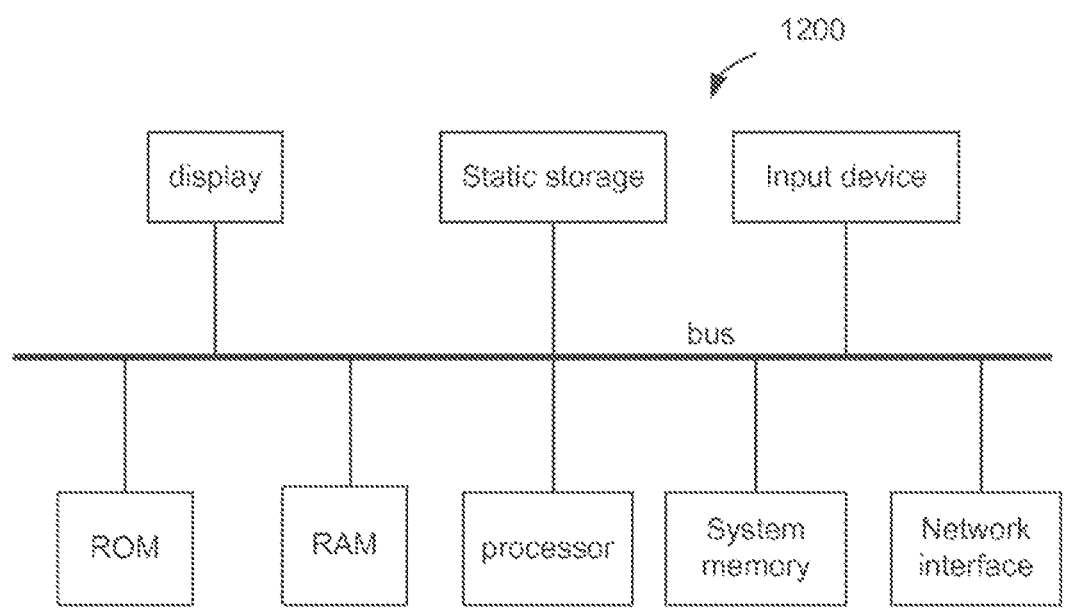
FIG. 12 is a simplified block diagram of an EDA system used to execute the software of the present invention.

FIG. 12 is a simplified block diagram of a computing apparatus 1200 that may be programmed to execute codes for routing an IC according to one embodiment of the present invention. As shown, computing apparatus 1200 includes a processor having one or more processing units, a system memory, static storage units (hard drive), a display unit (LCD), an input device (keyboard, mouse, optical disc or magnetic tape reader, and the like). Computer apparatus 900 also includes a network interface unit configured to connect the computing apparatus with other devices through a local area network, a wide area network, or a wireless network. In an embodiment, the display unit has one or more windows for displaying bumps assessment and assignment, bumps routing results, and one or more input fields for a user (e.g., package and/or system designer) to modify I/O pads constraints, pad order, pad pitches, pad-ring to assist the designer to complete the routing of the flip chip device. Embodiments of the present invention provide a snake-routing mode that pushes the nets against the perimeter of the obstacles (bumps) while observing the process design rules (DRC). Embodiments of the present invention thus, reserve resources for sneaking of power and ground nets through the open space obtained by the snake-routing mode.

Embodiments of the present invention provide many advantages that may include automatic detection of the sneak direction based on the reserved routing resources. For example, for sneak routing in the left side of FIG. 5, the vertical rectangle (channel) is chosen. For sneak routing in the right side of FIG. 5, the horizontal channel is chosen. Embodiments of the present invention take into account the closest P/G straps as the start point in a channel. Embodiments of the present invention place the endpoint at the farthest point and at the center of an available routing area within the channel, as shown in FIG. 10. Embodiments of the present invention route the power/ground net in the middle of the available routing resources in a channel.

According to embodiments of the present invention, the EDA tool completes the snake routing, channel partitioning, locating the power/ground strap in each channel, setting start and endpoints, interconnecting the start and endpoints, spreading and widening the interconnect wires while ensuring the design rule checking in minutes. In contrast, the conventional way to handle the sneaking of power/ground nets into the I/O area is to do it by hand. It is not possible for a designer to manually route the power/ground nets to the I/O area by visually ensuring that the design rule checking is not violated. Therefore, the hand-routed nets will certainly have to be redone many times if design rule checking locates that a hand-routed net violates process design rules. Furthermore, the hand-routed nets often are not as thorough as the ones automatically performed by the present invention. Moreover, the hand-routed nets have the same width as the I/O nets whereas the present invention provides power and ground nets having irregular widths to optimize power supply routing resources. As is known, increasing the power supply routing widths is helpful in improving IR voltage drop.

Functions and algorithms performed by the computing apparatus shown in FIG. 12 may include portioning the I/O region into a plurality of adjacent channels having a regular shape and open up spaces in the channels by utilizing snake-routing technique. The computing apparatus also performs searching straps for the power and ground bumps and calculating a routable area in a channel. The computing apparatus also includes program codes for setting start point and endpoint in a channel. The computing apparatus allows a user to enter a target power/ground ratio. In an embodiment, the computing apparatus may compute the initial power and ground ratio and exchange power and ground wires in a channel to achieve the target power/ground ratio. For example, if there are too many power wires, the computing apparatus will route ground wires first in the channels. The computing apparatus may include instruction codes that compute space available in a channel for spreading the power/ground nets and widening the width of the power/ground nets while ensuring the design rule checking. In an embodiment, the width of the sneaked nets can be widened in response to the space available in a channel. The partitioning of the I/O region into a plurality of regular-shaped channels allows a simplified and systematic sneaking of power/ground nets into the I/O region.

Figure 13:
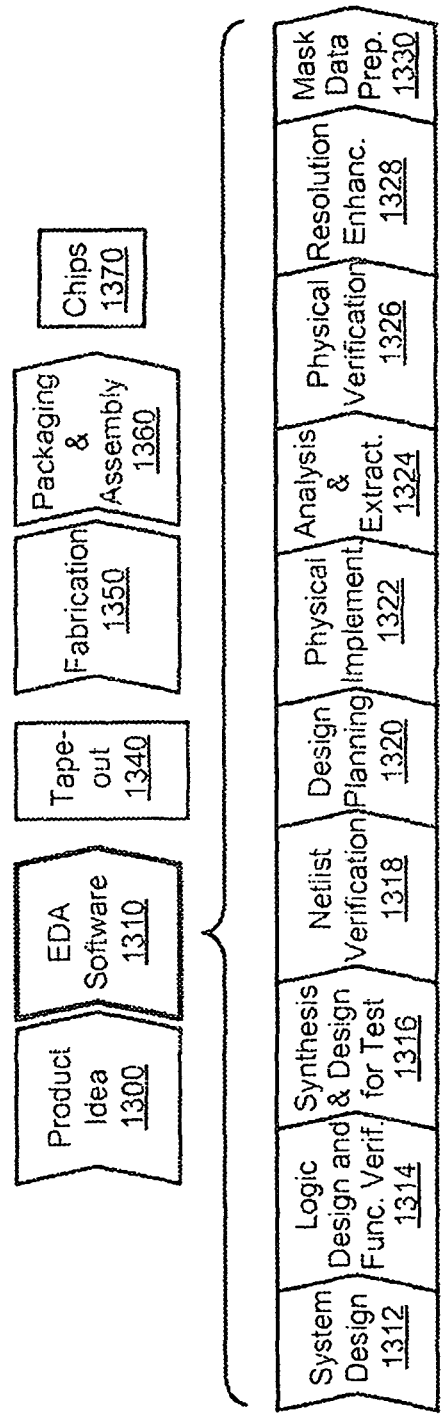
FIG. 13 depicts simplified exemplary steps in the design and fabrication of an integrated circuit that may use embodiments of the present invention.

FIG. 13 depicts simplified exemplary steps in the design and fabrication of an integrated circuit that may use embodiments of the present invention. The process starts with a product idea 1300, which is realized using Electronic Design Automation (EDA) software 1310. Chips 1370 can be produced from the finalized design by performing fabrication 1350 and packaging and assembly 1360 steps. An exemplary design flow that uses EDA software 1310 is described below for illustration purposes only. For example, an actual integrated circuit design may require a designer to perform the design flow steps in a different sequence than the sequence described below.

In the system design 1312, a designer describes the functionality to be implemented. The designer can also perform what-if planning to refine the functionality and to check costs. Further, hardware-software architecture partitioning can occur at this step. In the design and functional verification 1314, a Hardware Description Language (HDL) design may be created and checked for functional accuracy.

In the synthesis and design 1316, the HDL code can be translated to a netlist, which can be optimized for the target technology. Further, tests can be designed and implemented to check the finished chips. In the netlist verification 1318, the netlist can be checked for compliance with timing constraints and for correspondence with the HDL code. In the design planning 1320, an overall floor plan for the chip can be constructed and analyzed for timing and top-level routing. Next, in the physical implementation 1322, placement and routing can be performed.

In the analysis and extraction 1324, the circuit functionality can be verified at a transistor level. In the physical verification 1326, the design can be checked to correct any functional, manufacturing, electrical, or lithographic issues. In the resolution enhancement 1328, geometric manipulations can be performed on the layout to improve manufacturability of the design. Finally, in the mask data preparation 1330, the design can be taped-out 1340 for production of masks to produce finished chips. The embodiments of the present invention may be used, for example at the steps of design planning 1320 and/or physical implementation 1322.

Various embodiments of the present invention can be implemented in the form of logic in software or hardware or a combination of both. The logic may be stored in a computer readable or machine-readable storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims. In addition, the technique and system of the present invention is suitable for use with a wide variety of EDA tools and methodologies for designing, testing, and/or manufacturing integrated circuits or other electronic devices. The scope of the invention should, therefore, be determined not with reference to the above description, but instead should be determined with reference to the pending claims along with their full scope or equivalents.

What is claimed is:

1. A computer-implemented method for routing a flip-chip circuit device having an array of bumps, the computer-implemented method comprising:
   identifying, using the computer, a routing direction associated with a bump included in the flip-chip circuit device when the computer is invoked to identify the routing direction;
   forming, using the computer, a routing channel in accordance with the routing direction;
   setting, using the computer, a start point and an endpoint in the routing channel; and
   connecting, using the computer, the start point and the endpoint using a wire.

2. The computer-implemented method of claim 1, wherein identifying the routing direction is based on one or more pre-routed nets associated with the bump.

3. The computer-implemented method of claim 1, wherein forming the routing channel comprises:
   setting a boundary around the center of the bump;
   extending the boundary lengthwise in the routing direction;
   determining whether the boundary is extendable in the routing direction;
   if the boundary is extendable in the routing direction:
   extending the boundary until it contacts a power/ground (P/G) bump, a P/G strap, or a barrier; and
   if the boundary is not extendable in the routing direction:
   terminating the boundary extension.

4. The computer-implemented method of claim 3, further comprising:
extending the boundary widthwise in a direction orthogonal to the routing direction until the boundary reaches the center of adjacent bumps arranged lengthwise in the routing direction.

5. The computer-implemented method of claim 4, wherein the boundary straddles two adjacent P/G straps.

6. The computer-implemented method of claim 5, further comprising:
calculating a routing area within the boundary, the routing area having a first edge and a second edge opposite the first edge in the routing direction, the first edge associated with the start point and the second edge associated with the endpoint.

7. The computer-implemented method of claim 6, wherein the endpoint is located at the center of the second edge, and the wire interconnecting the start point and the endpoint comprises a plurality of partially overlapped segments, each of the overlapped segments having a regularly polygonal shape.

8. The computer-implemented method of claim 7, wherein the regularly polygonal shape is a rectangle or an octagon.

9. The computer-implemented method of claim 5, wherein the start point is electrically connected to a power strap or a ground strap in response to a target power/ground ratio.

10. The computer-implemented method of claim 1, further comprising:
sneaking the wire around bumps in the routing channel.

11. A non-transitory computer readable medium comprising instructions which when executed by a computer cause the computer to:
identify a routing direction associated with a bump pad included in a flip-chip design when the computer is invoked to identify the routing direction;
form a routing channel in accordance with the routing direction;
set a start point and an endpoint in the routing channel; and
connect the start point and the endpoint using a wire within the routing channel.

12. The non-transitory computer readable medium of claim 11, wherein the routing direction is identified based on one or more pre-routed nets associated with the bump pad.

13. The non-transitory computer readable medium of claim 11, wherein the instructions that cause the computer to form the routing channel further cause the computer to:
set a boundary around the center of the bump pad;
extend the boundary lengthwise in the routing direction;
determine whether the boundary is extendable in the routing direction;
if the boundary is extendable in the routing direction:
extend the boundary until the boundary is in contact with a power/ground (P/G) bump pad, a P/G strap, or a barrier; and
if the boundary is not extendable in the routing direction:
terminate the boundary extension.

14. The non-transitory computer readable medium of claim 13, further comprising instructions that cause the computer to:
extend the boundary widthwise in a direction orthogonal to the routing direction until the boundary reaches the center of adjacent bump pads arranged lengthwise in the routing direction, wherein the boundary straddles two adjacent P/G straps.

15. The non-transitory computer readable medium of claim 14, further comprising instructions that cause the computer to:
calculate a routing area within the boundary, wherein:
the routing area comprises a first edge and a second edge opposite the first edge in the routing direction, the first edge associated with the start point and the second edge associated with the endpoint;
the endpoint is located at the center of the second edge, and
the wire interconnecting the start point and the endpoint comprises a plurality of partially overlapped segments, each of the overlapped segments having a regularly polygonal shape.

16. The non-transitory computer readable medium of claim 11, further comprising instructions that cause the computer to:
sneak the wire around bump pads in the routing channel.

17. A system for routing a flip-chip circuit having an array of bump pads, the system comprising:
at least one processing unit configured to:
identify a routing direction associated with a bump pad included in the flip-chip circuit, when the system is invoked to identify the routing direction;
form a routing channel in response to the routing direction;
set a start point and an endpoint in the routing channel; and
connect the start point and the endpoint using a wire within the routing channel.

18. The system of claim 17, wherein the routing channel has a rectangular shape straddling a power strap and a ground strap.

19. The system of claim 18, wherein the start point is electrically connected to the power strap or the ground strap in response to a target power/ground ratio.

20. The system of claim 19, wherein the power trap or the ground trap is associated with a respective core power bump or a core ground bump, and the at least one processing unit is further configured to:
sneak the wire around bumps in the routing channel along the routing direction toward an I/O region.

21. The system of claim 17, wherein the at least one processing unit is further configured to:
calculate a routing area with the routing channel.

22. The system of claim 21, wherein the routing area comprises:
a first edge associated with the start point;
a second edge opposite the first edge in the routing direction and associated with the endpoint;
the endpoint located at the center of the second edge; and
the wire interconnecting the start point and the endpoint comprising a plurality of partially overlapped segments.

23. The system of claim 22, wherein each of the overlapped segments comprises a regularly polygonal shape.

24. The system of claim 23, wherein the regularly polygonal shape is a rectangle or an octagon.

* * * * *